United States Patent
Lu et al.

(10) Patent No.: US 8,427,888 B2
(45) Date of Patent: Apr. 23, 2013

(54) WORD-LINE DRIVER USING LEVEL SHIFTER AT LOCAL CONTROL CIRCUIT

(75) Inventors: Chung-Ji Lu, Fongyuan (TW); Lee-Cheng Hung, Hsinchu (TW); Hung-Jen Liao, Hsin-Chu (TW); Hsu-Shun Chen, Toufen Town, Miaoli County (TW); Hong-Chen Cheng, Hsinchu (TW); Chung-Yi Wu, Taipei (TW); Uppu Sharath Chandra, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 68 days.

(21) Appl. No.: 12/702,594

(22) Filed: Feb. 9, 2010

(65) Prior Publication Data

US 2011/0194362 A1    Aug. 11, 2011

(51) Int. Cl.
*G11C 7/00*    (2006.01)

(52) U.S. Cl.
USPC ............ 365/189.11; 365/189.09; 365/230.06; 365/185.23; 365/185.25; 365/185.18

(58) Field of Classification Search ............ 365/189.11, 365/189.09, 230.06, 185.23, 185.25, 185.18
See application file for complete search history.

(56) References Cited

U.S. PATENT DOCUMENTS

| | | | |
|---|---|---|---|
| 5,490,119 A | | 2/1996 | Sakurai et al. |
| 6,462,998 B1 * | | 10/2002 | Proebsting ..................... 365/205 |
| 6,774,673 B2 * | | 8/2004 | Tsuboi et al. ................... 326/68 |
| 7,023,738 B2 * | | 4/2006 | Vimercati et al. ....... 365/185.23 |
| 7,106,649 B2 * | | 9/2006 | Wada et al. .............. 365/230.06 |
| 7,423,910 B2 * | | 9/2008 | Umezawa ................ 365/185.23 |
| 7,512,007 B2 * | | 3/2009 | Terasawa et al. ........ 365/185.18 |
| 7,710,796 B2 * | | 5/2010 | Cottier et al. ............ 365/189.11 |
| 2009/0231941 A1 * | | 9/2009 | Sunaga ......................... 365/226 |

FOREIGN PATENT DOCUMENTS

| | | |
|---|---|---|
| JP | 7141887 A | 2/1995 |
| JP | 7254276 A | 3/1995 |
| JP | 2005222659 A | 8/2005 |
| KR | 20010109572 A | 12/2001 |

OTHER PUBLICATIONS

Office Action Oct. 31, 2011 in counterpart Korean application with translation.
Official Action issued Sep. 26, 2012, in JP Patent Application No. 2011-012039, which is the JP counterpart to present application.

* cited by examiner

*Primary Examiner* — Hoai V Ho
*Assistant Examiner* — Kretelia Graham
(74) *Attorney, Agent, or Firm* — Duane Morris LLP

(57) ABSTRACT

A representative circuit device includes a local control circuit having a level shifter, wherein in response to receipt of a first address signal the level shifter shifts the first address signal from a first voltage level to a second voltage level, providing a level shifted first address signal; and a word-line driver having at least one input for receiving a plurality of address signals, wherein the at least one input includes a first input that is coupled to the local control circuit to receive the level shifted first address signal, and an output that is electrically coupled to a word line of a memory cell array.

12 Claims, 5 Drawing Sheets

WORD-LINE DRIVER USING LEVEL SHIFTER AT LOCAL CONTROL CIRCUIT

TECHNICAL FIELD

The present disclosure relates generally to electrical circuits and, more particularly to memory circuit having word-line drivers and level shifters.

BACKGROUND

Typically, word-line drivers in memory having multiple voltage levels are used with level shifters to read and/or write to memory cells in the memory. The memory cells and word-line drivers operate at a higher voltage than other electrical components of the memory to obtain speed performance and data reliability. The other electrical components of the memory operates at a lower voltage than the memory cells and word-line drivers to reduce leakage consumption.

There are two traditional methods for using level shifters with the word-line drivers. The first method implements each word-line driver with a level shifter and the second method implements level shifters in a main control of the memory. In both methods the large number of level shifters used in memory consume large amounts of physical area. The methods also suffer from speed performance issues due to the gate delay of the level shifters as well as leakage consumption.

Desirable in the art is an improved word-line driver architecture.

SUMMARY

A representative circuit device includes a local control circuit having a level shifter, wherein in response to receipt of a first address signal the level shifter shifts the first address signal from a first voltage level to a second voltage level, providing a level shifted first address signal; and a word-line driver having at least one input for receiving a plurality of address signals, wherein the at least one input includes a first input that is coupled to the local control circuit to receive the level shifted first address signal, and an output that is electrically coupled to a word line of a memory cell array.

The above and other features of the present invention will be better understood from the following detailed description of the preferred embodiments of the invention that is provided in connection with the accompanying drawings.

BRIEF DESCRIPTION OF DRAWINGS

The accompanying drawings illustrate preferred embodiments of the invention, as well as other information pertinent to the disclosure, in which.

DETAILED DESCRIPTION

This description of the exemplary embodiments is intended to be read in connection with the accompanying drawings, which are to be considered part of the entire written description. Terms concerning attachments, coupling and the like, such as "connected" and "interconnected," refer to a relationship wherein structures are arranged to communicate with one another either directly or indirectly through intervening structures, unless expressly described otherwise.

Exemplary systems are first discussed with reference to the figures. Although these systems are described in detail, they are provided for purposes of illustration only and various modifications are feasible. After the exemplary systems are described, examples of circuits having level shifters at the local control circuits are provided.

Figure 1:
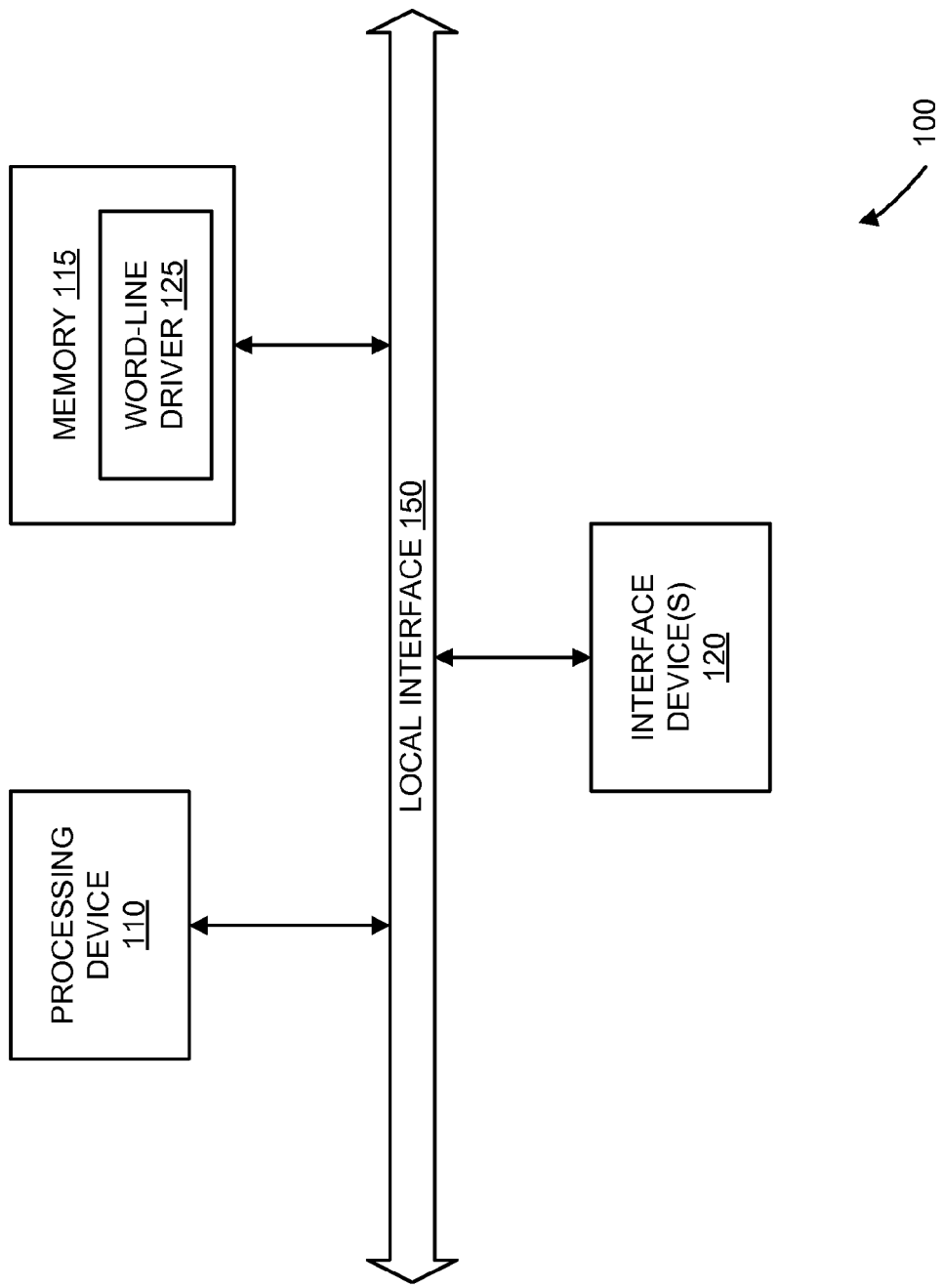
FIG. 1 is a block diagram of a system having a word-line driver in accordance with an embodiment of the invention.

FIG. 1 is a block diagram of a system 100 having a word-line driver 125 in accordance with an embodiment of the invention. The system 100 can be an exemplary architecture for a generic computer. The system 100 comprises a processing device 110, memory 115, and one or more user interface devices 120, each of which is connected to a local interface 150 (e.g., a bus). The processing device 110 can include any custom made or commercially available processor, a central processing unit (CPU) or an auxiliary processor among several processors associated with the generic computer, a semiconductor based microprocessor (in the form of a microchip), or a macroprocessor. The memory 115 can include any one or a combination of volatile memory elements (e.g., random access memory (RAM, such as DRAM, SRAM, etc.)) and nonvolatile memory elements (e.g., ROM, hard drive, tape, CDROM, etc.).

The one or more user interface devices 120 comprise those components with which the user (e.g., administrator) can interact with the system 100. Where the system 100 comprises a server computer or similar device, these components can comprise those typically used in conjunction with a PC such as a keyboard and mouse.

The memory 115 normally comprises various programs (in software and/or firmware) including an operating system (O/S). The O/S controls the execution of programs, and provides scheduling, input-output control, file and data management, memory management, and communication control and related services. The architecture of the memory 115 includes the word-line driver 125, which is further described in connection with FIGS. 2-5.

Figure 2:
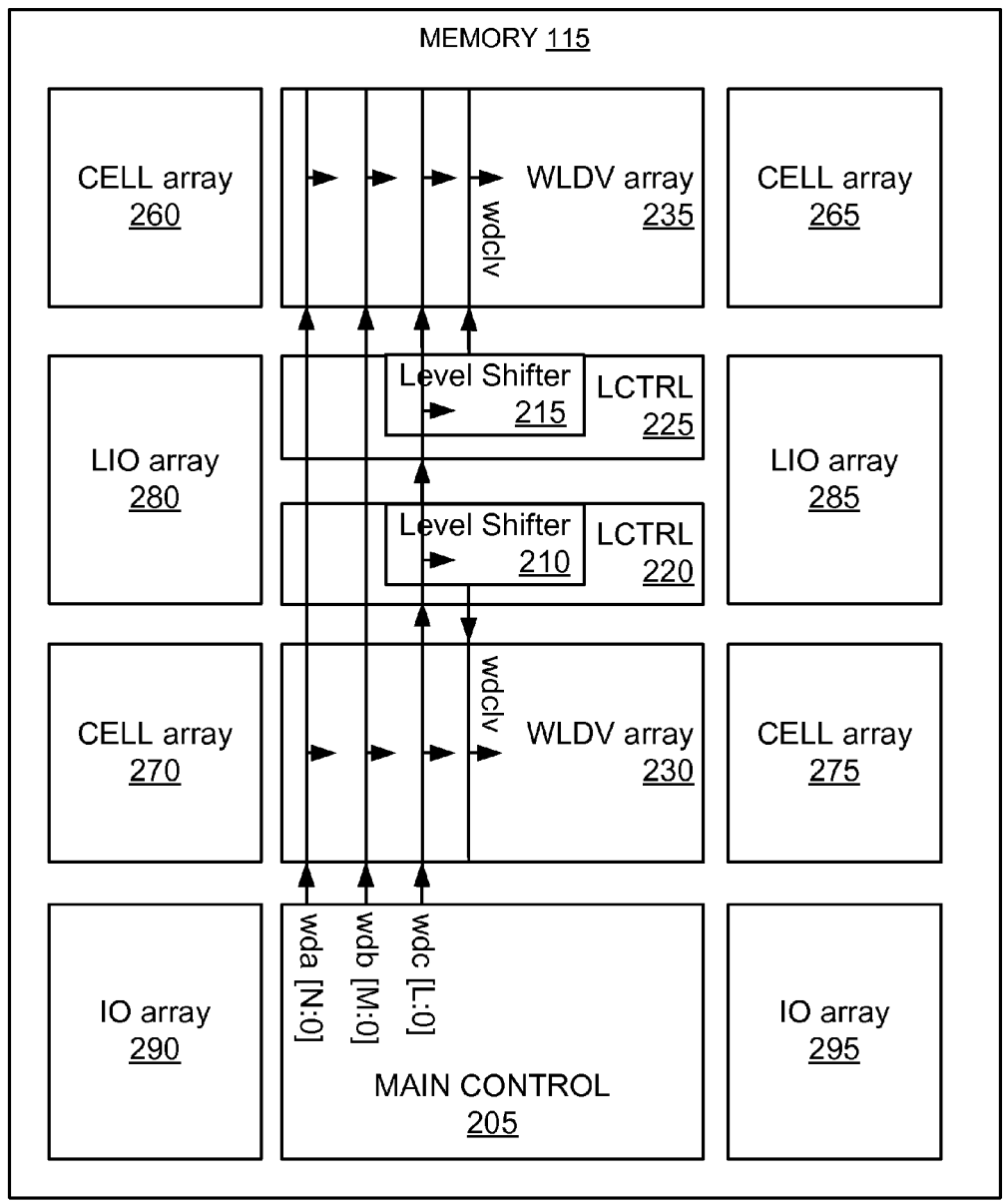
FIGS. 2 and 3 are block diagrams of memory having level shifters at local control circuits in accordance with an embodiment of the invention.
Figure 3:
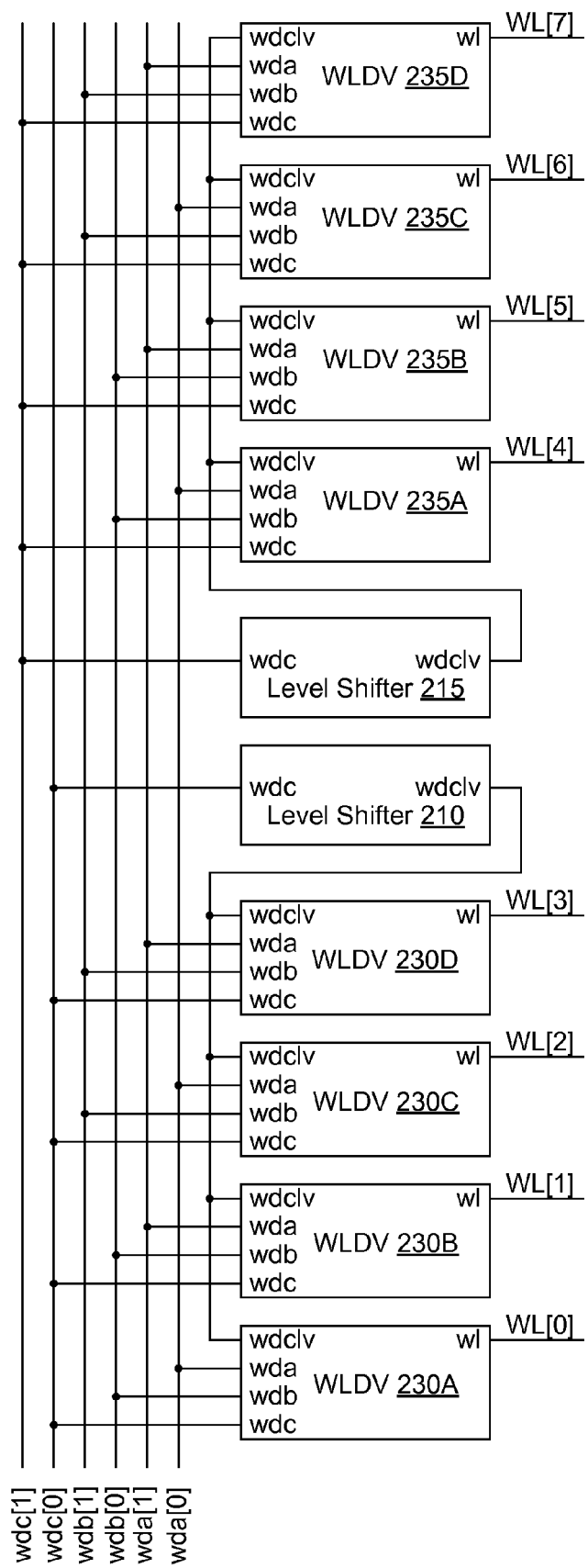

FIGS. 2 and 3 are block diagrams of memory 115 having level shifters 210, 215 at the local control circuits 220, 225 in accordance with an embodiment of the invention. In this example, the memory 115 can be an SRAM. The memory 115 includes a main control 205 that sends signals wda[N:0], wdb[M:0], and wdc[L:0] to word-line driver arrays 230, 235 and the local control circuits 220, 225. Referring to FIG. 3, wda[0] is coupled to wda inputs of word-line drivers 230A, 230C, 235A, 235C; wda[1] is coupled to wda inputs of word-line drivers 230B, 230D, 235B, 235D; wdb[0] is coupled to wdb inputs of word-line drivers 230A, 230B, 235A, 235B; wdb[1] is coupled to wdb inputs of word-line drivers 230C, 230D, 235C, 235D; wdC[0] is coupled to wdb inputs of word-line drivers 230A, 230B, 230C, 230D; and wdC[1] is coupled to wdb inputs of word-line drivers 235A, 235B, 235C, 235D.

In general, the function of the main control 205 is to control operations of the memory 115, such as, read/write function, address pre-decode for word line driver, chip enable/disable, self timing generation, and main input/output (I/O) array 290, 295 communication, among others. The function of the local control circuits 220, 225 is to control local input/output (I/O) array 280, 285 for local bit line pre-charge, write pass gate, and sense amplifier enable, among others.

The local control circuits 220, 225 having level shifters 210, 215 that raise the address signal wdc[L:0] to a higher operating voltage cvdd (FIG. 4) in response to receiving a high signal (e.g., "1" state). The level shifters 210, 215 output shifted address signal wdclv to the word-line driver arrays 230, 235. The word-line driver arrays 230, 235 process the address signals wda[N:0], wdb[M:0], wdc[L:0], wdclv for decoding at least one word line of the memory cell arrays 260, 265, 270, 275. The decoded word-line driver turns on the word line for memory read or write. The word-line driver arrays 230, 235 can further include decoder stages 305 (FIG. 5), respectively. The level shifters 210, 215 and the word-line driver arrays 230, 235 are further described in connection with FIGS. 4-5.

In this disclosure, the address signal wdc[L:0] instructs the local control circuits 220, 225 and the word-line driver arrays 230, 235 to turn on or off the memory cell array 260, 265, 270, 275. The address signals wda[N:0], wdb[M:0] facilitate selecting the word lines at memory cell array 260, 265. Although the three address signals wda[N:0], wdb[M:0], wdc[L:0] are shown in FIGS. 2-5, it would be appreciated by one skilled in the art that the disclosed circuitry and device can be implemented with any number of address signals, such as 8 or 16 address signals.

The local control circuits 220, 225 include respective level shifters 210, 215. The local control circuits 220, 225 use the local input-output arrays 280, 285 to communicate with memory cell arrays 260, 265, 270, 275, respectively. Input-output arrays 290, 295 are used to receive or send information stored in memory cell arrays 260, 265, 270, 275 to other electrical components such as the processing device 110 and/or user interface device 120 (FIG. 1). The local input-output arrays 280, 285 and input-output arrays 290, 295 are briefly mentioned to provide a system overview. The disclosure now focuses on various embodiments of the word-line drivers at the word-line driver arrays 230, 235 that are electrically coupled to the level shifters 210, 215 at the local control circuits 220, 225.

Figure 4:
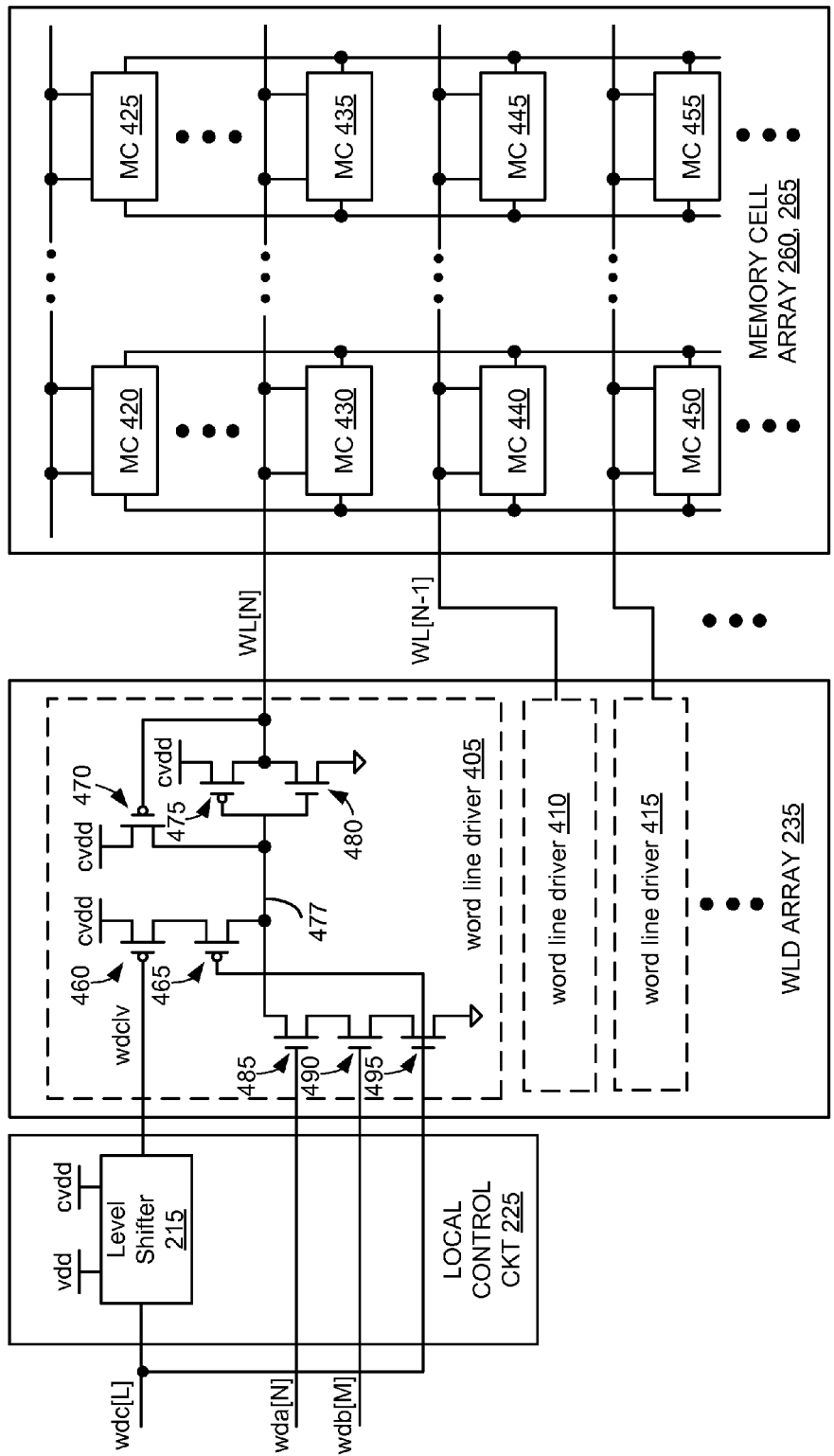
FIG. 4 is a circuit diagram of memory having a level shifter at a local control circuit and two-gate delay word-line drivers in accordance with an embodiment of the invention.

FIG. 4 is a circuit diagram of memory having a level shifter 215 at a local control circuit 225 and two-gate delay word-line drivers 405, 410, 415 in accordance with an embodiment of the invention. In this figure, the word-line driver 405 is a two-gate delay word-line driver that is generally used in high performance memory and does not have a timing impact in dual rail application. The first gate includes PMOS transistors 460, 465 and NMOS transistors 485, 490, 495. The second gate includes PMOS transistors 470, 475 and NMOS transistor 480.

The source of the PMOS transistor 460 is electrically coupled to a voltage source cvdd. The PMOS transistors 460, 465 and the NMOS transistors 485, 490 and 495 are coupled in series. The gates of the PMOS transistors 460, 465 and the NMOS transistors 485, 490 and 495 are electrically coupled to the output of the level shifter 215, address signal wdc[L], address signal wda[N], address signal wdb[M], and address signal wdc[L], respectively. The PMOS transistor 475 and NMOS transistor 480 are configured as an inverter having input and output that are coupled to the drain and gate of PMOS transistor 470, respectively. The source of the PMOS transistor 470 is electrically coupled to the voltage source cvdd.

Responsive to the address signals wda[N], wdb[M], and wdc[L] having a high signal (e.g., "1" state), the PMOS transistors 460, 465 are off and the NMOS transistors 485, 490 and 495 are on, which pulls the node 477 to a low signal (e.g., "0" state). Because PMOS transistor 465 does not receive the address signal wdc from the level shifter 215, the timing impact of the level shifter 215 has little to no affect on the word line rising edge. The gate delay of the level shifter 215, however, affects the word line falling edge. When node 477 has a low signal, the inverter at the second gate of the word-line driver 405 inverts the low signal to a high signal at the level of the voltage source cvdd, shown at line WL[N], which turns on the memory cell array 260, 265.

Responsive to the word-line driver 405 receiving a low signal (e.g., "0" state) from address signal wdc[L], the word-line driver 405 turns off and thus, turns off the memory cell arrays 260, 265. The level shifter 215 does not shift the low signal from address signal wdc[L] to cvdd. Instead, the level shifter 215 passes the low signal to the PMOS transistor 460. The PMOS transistors 460, 465 receive the low signal from the address signal wdc[L] via the level shifter 215 and the main control 205, respectively. Responsive to receiving the low signal, the PMOS transistors 460, 465 charge the node 477 to the high voltage source cvdd. When node 477 is high, the inverter at the second gate of the word-line driver 405 inverts the high signal to a low signal at the word line of the memory cell array 260, 265, shown at line WL[N], which turns off the memory cell array 260, 265.

By using a single level shifter 215 at local control circuit 225, the local control circuit 225 can communicate with the word-line drivers 405, 410, 415 and other word-line drivers of the word-line driver array 235 to process the address signals wda[N], wdb[M], wdc[L] for decoding at least one word line of the memory cell arrays 260, 265. In this example, the word-line drivers 405, 410, 415 are coupled to the memory cells 430, 435, 440, 445, 450, 455, respectively. It should be noted that the memory cells 420, 425 are not coupled to any word-line drivers 405, 410, 415 in this particular figure, but one skilled in the art would appreciate that these memory cells 420, 425 can be coupled to a word-line driver in the word-line driver array 235.

Figure 5:
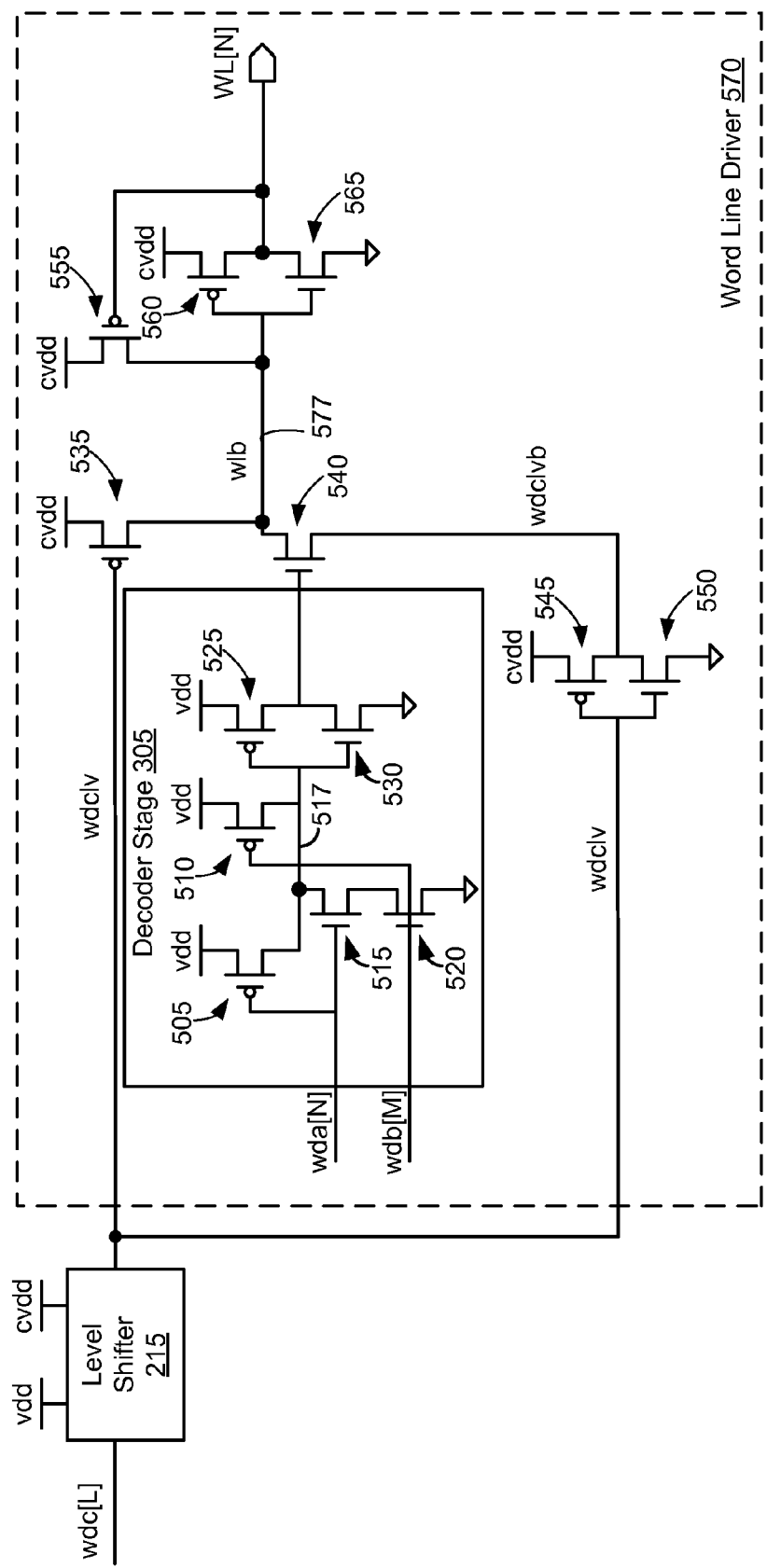
FIG. 5 is a circuit diagram of memory having a level shifter at a local control circuit and a four-gate delay word-line driver in accordance with an embodiment of the invention.

FIG. 5 is a circuit diagram of memory having a level shifter 215 at a local control circuit 225 and a four-gate delay word-line driver 570 in accordance with an embodiment of the invention. The word-line driver 570 is a four-gate delay word-line driver that is generally used in memory without timing impact in dual rail application. The decoder stage 305 includes the first and second stages of the four-gate delay word-line driver 570. The first stage includes PMOS transistors 505, 510 and NMOS transistors 515, 520 coupled in series. The source of the PMOS transistors 505, 510 is electrically coupled to voltage source vdd. The gates of the PMOS transistors 505, 510 and NMOS transistors 515, 520 are inputted with address signals wda[N] and wdb[M], respectively.

The second stage of the decoder stage 305 includes an inverter having PMOS transistor 525 and NMOS transistor 530. Node 517 is electrically coupled to the input of the inverter at the second stage. It should be appreciated by those skilled in the art that the decoder stage 305 can decode more than two address signals wda[N], wdb[M] depicted in FIG. 5. The decoder stage 305 can be any decoder circuit using the voltage source vdd, which reduces leakage consumption in the memory 115. In general, there is a decoder stage at each and every word-line driver in the word-line driver array. The decoder input wda[N] and wdb[M] connect to one signal of wda[N:0] and one signal of wdb[M:0].

The output of the inverter at the second stage is electrically coupled to the gate of a NMOS transistor 540. A third stage of the word-line driver includes PMOS transistor 535, NMOS transistor 540, and inverter having PMOS transistor 545 and NMOS transistor 550. The input and output of the inverter at the third stage are coupled to the signal wdclv and the drain of NMOS transistor 540, respectively. The source, gate and drain of the PMOS transistor 535 are coupled to the voltage source cvdd, the output of the level shifter 215, and the drain of the NMOS transistor 540, respectively. The fourth stage of the word-line driver 570 is similar to the second stage of the word-line driver 405, shown in FIG. 4. Thus, the fourth stage of the word-line driver 570 includes PMOS transistor 555 and an inverter having PMOS transistor 560 and NMOS transistor 565.

When the address signal wdc[L] is a high signal, the inverter having the PMOS transistor 545 and NMOS transistor 550 inverts the high signal to low signal. The decoder stage 305 receives and decodes the address signals wda[N], wdb [M] to determine whether to turn on or off the NMOS transistor 540. If the NMOS transistor 540 is turned on, the inverter having the PMOS transistor 545 and NMOS transistor 550 outputs the low signal to node 577. The inverter at the fourth gate inverts the low signal to the high signal at node WL[N]. If the NMOS transistor 540 is turned off, the node 577 is pulled to cvdd by PMOS transistor 555 because WL[N] is low initially.

Because the address signal wdc[L] bypasses a decoder stage 305, and the address signals wda, wdb pass through the decoder stage 305, the word-line driver 570 can output the word line rising edge with little or no gate delay impact from the level shifter 215 responsive to the address signal wdc[L] having a high signal at the inverter of PMOS transistor 545 and NMOS transistor 550. When the word-line driver 570 is in the off state, the node 577 is charged to voltage source cvdd where the inverter at the fourth gate inverts the high signal to a low signal.

The circuit architecture disclosed above reduces the number of level shifters used in a dual power memory device by implementing the level shifters 210, 215 at the local control circuits 220, 225. In addition, the gate delays that are typically caused by the level shifters 210, 215 are reduced by bypassing the address signal wdc[L] to PMOS transistor 465, such as that shown in FIG. 4, and by bypassing the decoder stage 305 to an inverter having PMOS transistor 545 and NMOS transistor 550, such as that shown in FIG. 5. In particular, the rising edge of the output of the word-line driver 405, 570 has little to no gate delays from the level shifters 210, 215; however, the falling edge of the output of the word-line driver 405, 570 is delayed due to the level shifters 210, 215.

Although the invention has been described in terms of exemplary embodiments, it is not limited thereto. Rather, the appended claims should be construed broadly to include other variants and embodiments of the invention that may be made by those skilled in the art without departing from the scope and range of equivalents of the invention.

What is claimed is:

1. A circuit device comprising:
a local control circuit having a level shifter configured to shift a first address signal received from a main control circuit from a first voltage level to a second voltage level to provide a level shifted first address signal; and
a word-line driver configured to receive at least one signal from the main control circuit and to receive the level shifted first address signal from the local control circuit, and the word line driver including an output that is electrically coupled to a word line of a memory cell array,
wherein the word-line driver includes at least two-gate delays comprising a first gate having a first transistor for receiving the level shifted first address signal from the level shifter and a second transistor for receiving the first address signal, which reduces gate delay from the level shifter,
wherein the second transistor is provided between a power supply terminal and an output of the first gate and is coupled in series with the first transistor, and
wherein the first gate includes the second transistor that, when outputting a low signal responsive to receiving a high signal from the first address signal, turns off prior to the first transistor to reduce the gate delay from the level shifter.

2. A circuit device, comprising:
a local control circuit having a level shifter, wherein in response to receipt of a first address signal the level shifter shifts the first address signal from a first voltage level to a second voltage level, providing a level shifted first address signal; and
a two-gate delay word-line driver having at least one input for receiving a plurality of address signals, wherein the at least one input includes a first input that is coupled to the local control circuit to receive the level shifted first address signal, and an output that is electrically coupled to a word line of a memory cell array,
wherein the two-gate delay word-line driver reduces gate delay from the level shifter and includes a first gate having a first transistor to receive the level shifted first address signal from the level shifter and a second transistor to receive the first address signal, wherein the first gate outputs a low signal responsive to receiving a high signal from the first address signal.

3. The circuit device of claim 2, wherein the two-gate delay word-line driver further includes a second gate having an inverter to receive the output of the first gate, wherein an output of the second gate is electrically coupled to the word line of the memory cell array.

4. The circuit device of claim 1, wherein the word-line driver is a four-gate delay word-line driver.

5. The circuit device of claim 4, wherein the four-gate delay word-line driver includes a decoder stage that includes a second gate and a third gate to receive second and third address signals of a plurality of address signals received at the four-gate delay word-line driver.

6. The circuit device of claim 5, wherein the four-gate delay word-line driver reduces gate delay from the level shifter and includes a fourth gate having a third transistor and a first inverter to receive the level shifted first address signal, wherein the third gate outputs a low signal responsive to receiving a high signal from the first address signal.

7. The circuit device of claim 6, wherein the four-gate delay word-line driver further includes a fourth gate having an inverter to receive the output of the third gate, wherein an output of the fourth gate is electrically coupled to the word line of the memory cell array.

8. The circuit device of claim 1, wherein the word-line driver includes inputs for receiving second and third address signals from the main control circuit.

9. A memory circuit comprising:
a local control circuit having a level shifter for shifting a first address signal received from a main control circuit from a first voltage level to a second voltage level to provide a level shifted first address signal;
a word-line driver configured to receive the level shifted address signal from the level shifter and a plurality of address signals from the main control circuit; and
a memory cell array having a word line that is coupled to an output of the word-line driver, wherein the world-line driver is a two-gate delay word-line driver comprising a first gate having a first transistor for receiving the level shifted first address signal from the level shifter and a second transistor for receiving the first address signal, which reduces gate delay from the level shifter, wherein the second transistor is provided between a power supply terminal and an output of the first gate and is coupled in series with the first transistor, and wherein the first gate includes the second transistor that, when outputting a low signal responsive to receiving a high signal from the first address signal, turns off prior to the first transistor to reduce the gate delay from the level shifter.

10. The memory circuit of claim 1, wherein word-line driver includes a second gate having an inverter to receive the output of the first gate, wherein an output of the second gate is electrically coupled to the word line of the memory cell array.

11. A memory circuit, comprising:
a local control circuit having a level shifter, wherein in response to receipt of a first address signal the level shifter shifts the first address signal from a first voltage level to a second voltage level, providing a level shifted first address signal;

a four-gate delay word-line driver having at least one input for receiving a plurality of address signals, wherein the at least one input includes a first input to receive the level shifted address signal from the level shifter; and a memory cell array having a word line that is coupled to an output of the word-line driver, wherein the four-gate delay word-line driver includes a decoder stage that includes a first gate and second gate to receive second and third address signals of the plurality of address signals, wherein the four-gate delay word-line driver reduces gate delay from the level shifter and includes a third gate having a first transistor to receive the first address signal from the level shifter and a first inverter to receive the first address signal, wherein the third gate outputs a low signal responsive to receiving a high signal from the first address signal.

12. The memory circuit of claim 11, wherein the four-gate delay word-line driver further includes a fourth gate having an inverter to receive the output of the third gate, wherein an output of the fourth gate is electrically coupled to the word line of the memory cell array.

* * * * *